(12) United States Patent
Huang

(10) Patent No.: US 8,456,321 B2
(45) Date of Patent: Jun. 4, 2013

(54) CIRCUIT FOR CHECKING THE VOLTAGE OF BATTERIES

(75) Inventor: Yong-Zhao Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 180 days.

(21) Appl. No.: 13/093,871

(22) Filed: Apr. 26, 2011

(65) Prior Publication Data
US 2012/0242496 A1 Sep. 27, 2012

(30) Foreign Application Priority Data
Mar. 25, 2011 (CN) .......................... 2011 1 0073008

(51) Int. Cl.
*G01N 27/416* (2006.01)
*G08B 5/36* (2006.01)
*G10K 9/12* (2006.01)

(52) U.S. Cl.
USPC ................ 340/815.45; 340/388.1; 340/384.1; 340/815.4; 340/384.4; 324/426; 361/92; 320/132; 320/134; 320/135; 320/136

(58) Field of Classification Search
None
See application file for complete search history.

(56) References Cited

U.S. PATENT DOCUMENTS

| | | | | |
|---|---|---|---|---|
| 3,810,144 A | * | 5/1974 | Clouse | 340/636.1 |
| 4,019,112 A | * | 4/1977 | Satoh | 340/636.15 |
| 4,030,086 A | * | 6/1977 | Salem | 340/636.15 |
| 4,318,092 A | * | 3/1982 | Cowles et al. | 340/636.15 |
| 4,829,290 A | * | 5/1989 | Ford | 340/663 |
| 5,073,837 A | * | 12/1991 | Baek | 361/92 |
| 5,587,916 A | * | 12/1996 | Martinson et al. | 702/64 |
| 7,034,581 B2 | * | 4/2006 | Sudou | 327/77 |
| 7,928,776 B2 | * | 4/2011 | Wang et al. | 327/143 |
| 8,189,312 B2 | * | 5/2012 | Lohr et al. | 361/92 |
| 8,258,971 B2 | * | 9/2012 | Huang | 340/663 |

* cited by examiner

*Primary Examiner* — Benjamin C Lee
*Assistant Examiner* — Rajsheed Black-Childress
(74) *Attorney, Agent, or Firm* — Altis Law Group, Inc.

(57) ABSTRACT

A circuit is for checking the voltage of a battery. The circuit includes a regulator component, a pnp type transistor, an npn transistor, a diode, and an alarm. The circuit activates an alarm when the voltage of the battery is less than a preset value.

6 Claims, 2 Drawing Sheets

CIRCUIT FOR CHECKING THE VOLTAGE OF BATTERIES

BACKGROUND

1. Technical Field

The present disclosure relates to a circuit for checking the voltage of a battery.

2. Description of Related Art

For most electronic devices, users hardly know whether a battery needs to be replaced unless the battery is exhausted. It may be inconvenient for users.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
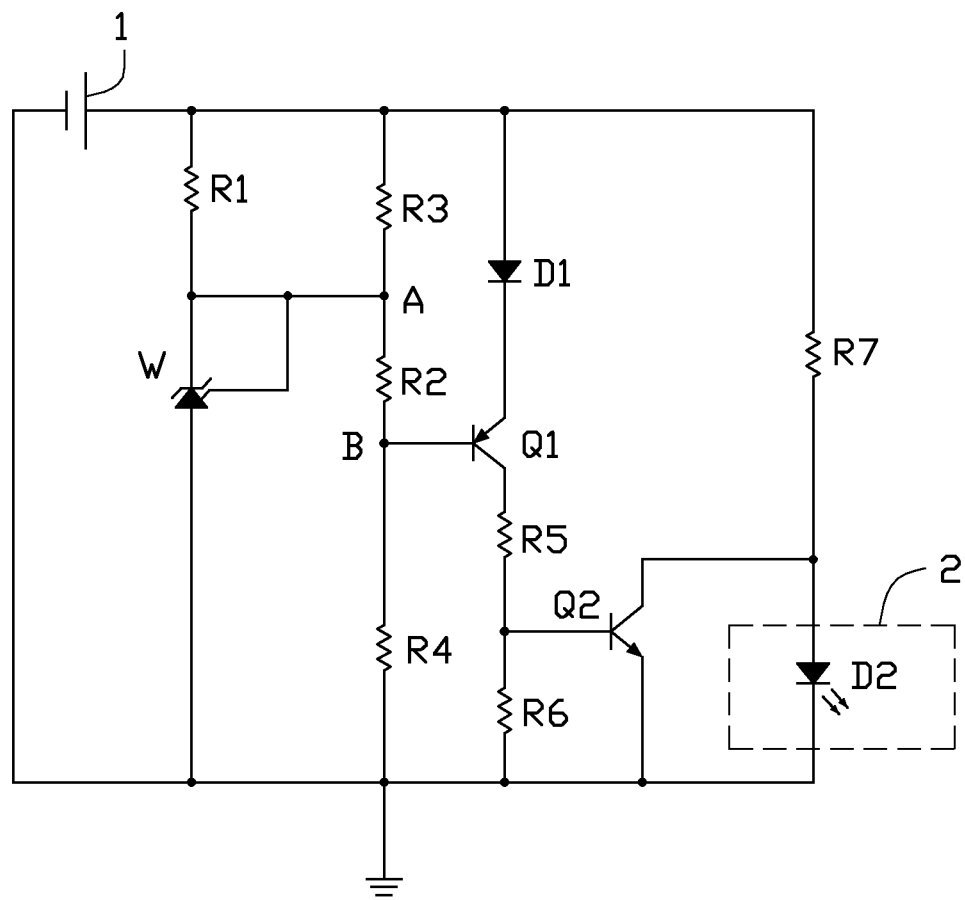
FIG. 1 is a circuit diagram of a first exemplary embodiment of a circuit for checking the voltage of a battery.

Referring to FIG. 1, a circuit is provided for checking the voltage of a battery 1, and warning users when the voltage of the battery 1 is less than a preset value. A first embodiment of the circuit includes a Zener shunt regulator W, a pnp type transistor Q1, an npn type transistor Q2, a diode D1, a light emitting diode (LED) D2, and resistors R1-R7.

A cathode of the Zener shunt regulator W is connected to a positive pole of the battery 1 through the resistor R1. A reference terminal of the Zener shunt regulator W is connected to a base of the transistor Q1 through the resistor R2, and is connected to the positive pole of the battery 1 through the resistor R3. The reference terminal of the Zener shunt regulator W is further connected to a cathode of the Zener shunt regulator W. An anode of the Zener shunt regulator W is grounded. The base of the transistor Q1 is grounded through the resistor R4. An emitter of the transistor Q1 is connected to a cathode of the diode D1. A collector of the transistor Q1 is grounded through the resistors R5 and R6 in series. An anode of the diode D1 is connected to the positive pole of the battery 1. The negative pole of the battery 1 is grounded.

A base of the transistor Q2 is connected to a node between the resistors R5 and R6. An emitter of the transistor Q2 is grounded. A collector of the transistor Q2 is connected to an anode of the LED D2. The collector of the transistor Q2 is further connected to the positive pole of the battery 1 through the resistor R7. A cathode of the LED D2 is grounded.

If the voltage at the node between resistor R3 and R2 is Va and the node between resistors R2 and R4 is Vb, then using the voltage divider formula, we have: Vb=Va×R4/(R2+R4). In the embodiment, the Zener shunt regulator W is used for outputting a steady voltage. In other embodiments, the Zener shunt regulator W can be replaced with other regulator components, which can output a steady voltage.

According to the characteristic of the pnp transistor, when a voltage at the emitter is at least 0.7 volt (V) greater than a voltage at the base of the pnp transistor, the pnp transistor turns on. In other words, when the function of VE1≧VB+0.7 is satisfied, the npn transistor Q1 turns on. In the function, VE1 stands for a voltage at the emitter of the pnp transistor Q1, VB stands for a voltage at the base of the pnp transistor Q1. Moreover, according to the characteristic of the diode, when a diode works, a voltage at the anode of the diode is 0.7V, which is greater than a voltage at the cathode of the diode. In other words, the function of VE1=Vbat−0.7 is satisfied, wherein Vbat stands for a voltage of the battery 1.

As a result, when the function of Vbat≧VB+1.4 is satisfied, the transistor Q1 turns on. At this time, the transistor Q2 turns on. A voltage at the anode of the LED D2 is a low level voltage. The LED D2 does not light.

When the function of Vbat<VB+1.4 is satisfied, the transistor Q1 turns off. At this time, the npn transistor Q2 turns off. A voltage at the anode of the LED D2 is a high level voltage. The LED D2 lights. As a result, when the voltage of the battery 1 is lower than the voltage at the node B plus 1.4V, the LED D2 lights. In this way, the voltage VW at the reference terminal of the Zener shunt regulator W, and the resistance of the resistors R2 and R3 can be changed to obtain a desired preset value, when the voltage of the battery 1 is less than the preset value, the LED D2 lights to warn the users.

Figure 2:
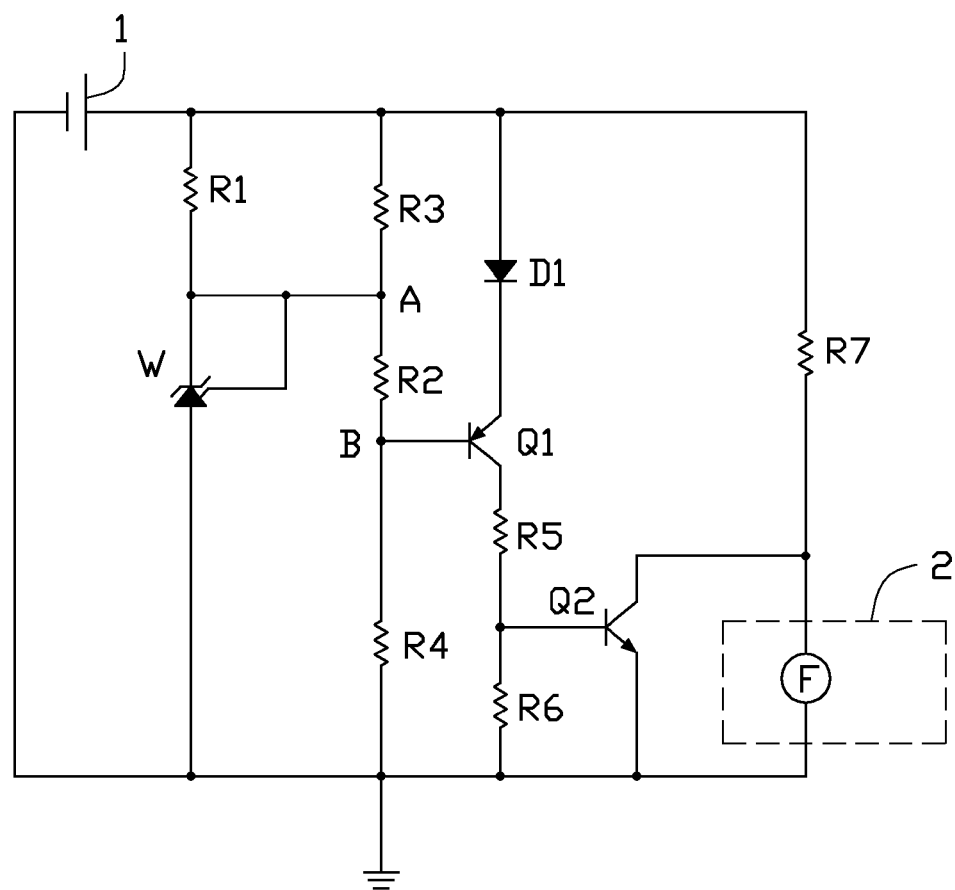
FIG. 2 is a circuit diagram of a second exemplary embodiment of a circuit for checking the voltage of a battery.

Referring to FIG. 2, a second embodiment of a circuit includes a Zener shunt regulator W, a pnp type transistor Q1, an npn type transistor Q2, a diode D1, resistors R1-R7, and a buzzer F. When the voltage of the battery 1 is less than the preset value, the buzzer F works to warn the users. In addition, the LED D2 or the buzzer F can be replaced with other alarms.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A circuit for checking voltage of a battery, the circuit comprising:

a Zener shunt regulator; a pnp type transistor; an npn type transistor; a diode; first, second, third, fourth, and fifth resistors; and a light emitting diode;

wherein a cathode of the Zener shunt regulator is connected to a positive pole of the battery, a reference terminal of the Zener shunt regulator is connected to a base of the pnp type transistor through the first resistor, an anode of the Zener shunt regulator is grounded, the reference terminal of the Zener shunt regulator is further connected to the positive pole of the battery, the base of the pnp type transistor is grounded through the second resistor, an emitter of the pnp type transistor is connected to a cathode of the diode, an anode of the diode is connected to the positive pole of the battery, a base of the npn type transistor is connected to a collector of the pnp type transistor through the third resistor, an emitter of the npn transistor is grounded, a collector of the npn transistor is connected to a positive pole of the light emitting diode, a negative pole of the light emitting diode is grounded, the collector of the npn transistor is further connected to the positive pole of the battery through the fourth resistor, the base of the npn type transistor is grounded through the fifth resistor, and a negative pole of the battery is grounded.

2. The circuit of claim 1, wherein the cathode of the Zener shunt regulator is connected to a positive pole of the battery through a sixth resistor.

3. The circuit of claim 1, wherein the reference terminal of the Zener shunt regulator is connected to the positive pole of the battery through a seventh resistor.

4. A circuit for checking voltage of a battery, the circuit comprising:
   a Zener shunt regulator; a pnp type transistor; an npn type transistor; a diode; first, second, third, fourth, and fifth resistors; and a buzzer;
   wherein a cathode of the Zener shunt regulator is connected to a positive pole of the battery, a reference terminal of the Zener shunt regulator is connected to a base of the pnp type transistor through the first resistor, an anode of the Zener shunt regulator is grounded, the reference terminal of the Zener shunt regulator is further connected to the positive pole of the battery, the base of the pnp type transistor is grounded through the second resistor, an emitter of the pnp type transistor is connected to a cathode of the diode, an anode of the diode is connected to the positive pole of the battery, a base of the npn type transistor is connected to a collector of the pnp type transistor through the third resistor, an emitter of the npn transistor is grounded, a collector of the npn transistor is connected to a pole of the buzzer, another pole of the buzzer is grounded, the collector of the npn transistor is further connected to the positive pole of the battery through the fourth resistor, the base of the npn type transistor is grounded through the fifth resistor, and a negative pole of the battery is grounded.

5. The circuit of claim 4, wherein the cathode of the Zener shunt regulator is connected to a positive pole of the battery through a sixth resistor.

6. The circuit of claim 4, wherein the reference terminal of the Zener shunt regulator is connected to the positive pole of the battery through a seventh resistor.

* * * * *